United States Patent
Rondeau, II et al.

(10) Patent No.: US 6,243,282 B1
(45) Date of Patent: Jun. 5, 2001

(54) APPARATUS FOR ON-BOARD PROGRAMMING OF SERIAL EEPROMS

(75) Inventors: Thomas C. Rondeau, II; Allan R. Magee, both of Boise, ID (US)

(73) Assignee: Micron Technology Inc., Boise, ID (US)

(*) Notice: Subject to any disclaimer, the term of this patent is extended or adjusted under 35 U.S.C. 154(b) by 0 days.

(21) Appl. No.: 09/659,471

(22) Filed: Sep. 11, 2000

Related U.S. Application Data

(63) Continuation of application No. 09/382,570, filed on Aug. 25, 1999, which is a continuation of application No. 08/873,971, filed on Jun. 12, 1997, now Pat. No. 5,963,463, which is a continuation of application No. 08/648,555, filed on May 15, 1996, now Pat. No. 5,661,677.

(51) Int. Cl.[7] .................................................. G11C 5/02
(52) U.S. Cl. .................................. 365/52; 365/51; 365/63
(58) Field of Search .................................. 365/51, 52, 63, 365/185.08, 230.03

(56) References Cited

U.S. PATENT DOCUMENTS

| | | | |
|---|---|---|---|
| 4,436,584 | 3/1984 | Bernacki et al. | 156/643 |
| 4,498,151 | 2/1985 | Henry | 364/900 |
| 4,750,136 | 6/1988 | Arpin et al. | 364/514 |
| 4,763,333 | 8/1988 | Byrd | 371/66 |
| 4,783,766 | 11/1988 | Samachisa et al. | 365/185 |
| 4,785,424 | 11/1988 | Lin et al. | 365/185 |

(List continued on next page.)

OTHER PUBLICATIONS

U.S. Patent #5,790,890, "Identification Interface," issued Aug. 4, 1998, inventors: Mirov and Odisho.

SGS–Thomson Microelectronics, Write Protection In the 12C and X12C EEPROM Families, Application Note, Y. Bahout, author.

IBM Technical Disclosure & Bulletin, vol. 38, No. 02, Feb. 1995.

Intel Corporation, 66 MHz 64–Bit Unbuffered SDRAM DIMM Revision 1.1, 43 pages Jan. 29, 1996.

JEDEC Standard No. 21–C, *Configurations for State Memories*, pp. 4.1.2–1 to 4.1.2–4, http://www.jedec.org/download/pub21/ updated Feb. 8, 2000, "Serial Presence Detect Standard, General Standard."

(List continued on next page.)

*Primary Examiner*—Son Mai
(74) *Attorney, Agent, or Firm*—Knobbe, Matens, Olson & Bear, LLP

(57) ABSTRACT

A memory module is described which can be programmed with module information, identifying the type and size of the memory module, after complet assembly of the memory module. The memory module includes a plurality of edge connectors for electrically connecting the memory module circuitry external to the memory module, and a plurality of DRAM memory devices electrically connected to corresponding edge connectors for receiving and providing data from and to the external circuitry. The memory module also includes a Serial EEPROM for storing the module information. The Serial EEPROM has a Serial Data pin connected to a first of the edge connectors for providing the module information to the external circuitry. The Serial EEPROM has a Write Control pin for receiving an enabling signal which selectively enables the operation of the Serial EEPROM in Write or Read-Only mode. The memory module further includes interface circuitry which couples the Write Control pin with a second and a third of the edge connectors. The Write Control pin is coupled to the second edge connector, where $V_{SS}$ is applied, by circuit element, such as a jumper, suitable for temporarily connecting the Write Control pin to the second edge connector. A resistor couples the Write Control pin to the third edge connector where $V_{CC}$ is applied.

14 Claims, 2 Drawing Sheets

U.S. PATENT DOCUMENTS

| | | | |
|---|---|---|---|
| 4,800,533 | 1/1989 | Arakawa | 365/228 |
| 4,855,955 | 8/1989 | Cloaca | 365/185 |
| 4,888,738 | 12/1989 | Wong et al. | 365/218 |
| 4,975,878 | 12/1990 | Boddu et al. | 365/189.07 |
| 4,975,883 | 12/1990 | Baker et al. | 365/226 |
| 4,992,137 | 2/1991 | Cathey, Jr. et al. | 156/643 |
| 5,029,131 | 7/1991 | Vancu | 365/185 |
| 5,047,979 | 9/1991 | Leung | 365/154 |
| 5,101,379 | 3/1992 | Lin et al. | 365/185 |
| 5,197,034 | 3/1993 | Fandrich et al. | 365/227 |
| 5,224,070 | 6/1993 | Fandrich et al. | 365/185 |
| 5,243,577 | 9/1993 | Ueda et al. | 365/229 |
| 5,262,990 | 11/1993 | Mills et al. | 365/189.02 |
| 5,274,778 | 12/1993 | Hall | 395/425 |
| 5,274,827 | 12/1993 | Haggerty et al. | 395/750 |
| 5,325,368 | 6/1994 | James et al. | 371/22.3 |
| 5,383,147 | 1/1995 | Sanemitsu | 365/52 |
| 5,383,148 | 1/1995 | Testa et al. | 365/52 |
| 5,383,161 | 1/1995 | Sanemitsu | 365/230.06 |
| 5,384,748 | 1/1995 | Sanemitsu | 365/229 |
| 5,436,862 | 7/1995 | Sanemitsu | 365/189.01 |
| 5,475,854 | 12/1995 | Thomsen et al. | 395/800 |
| 5,479,498 | 12/1995 | Brandman et al. | 379/283 |
| 5,486,129 | 1/1996 | Sandhu et al. | 451/5 |
| 5,495,593 | 2/1996 | Elmer et al. | 395/430 |
| 5,517,646 | 5/1996 | Piccirillo et al. | 395/700 |
| 5,519,831 | 5/1996 | Holzhammer | 395/182.2 |
| 5,572,457 | 11/1996 | Michael | 365/52 |
| 5,613,094 | 3/1997 | Khan et al. | 395/500 |
| 5,661,677 | 8/1997 | Rondeau, II et al. | 365/63 |
| 5,663,901 | 9/1997 | Wallace et al. | 365/52 |
| 5,732,017 | 3/1998 | Schumann et al. | 365/185.11 |
| 5,774,647 | 6/1998 | Raynham et al. | 395/185.01 |
| 5,790,890 | 8/1998 | Mirov et al. | 395/835 |
| 5,859,792 | 1/1999 | Rondeau, II et al. | 365/52 |
| 5,862,314 | * 1/1999 | Jeddeloh | 395/182.06 |
| 5,953,243 | 9/1999 | Capps, Jr. et al. | 365/52 |
| 5,963,463 | 10/1999 | Rondeau, II et al. | 365/52 |
| 5,963,464 | 10/1999 | Dell et al. | 365/52 |
| 5,974,500 | 10/1999 | Maletsky et al. | 711/103 |
| 5,991,194 | 11/1999 | Jigour et al. | 365/185.04 |
| 5,995,405 | * 11/1999 | Trick | 365/63 |
| 6,067,593 | 5/2000 | Schade | 710/126 |

OTHER PUBLICATIONS

JEDEC Standard No. 21–C, *Configurations for State Memories*, pp. 4.4.7–1 to 4.4.7–4, http://www.jedec.org/download/pub21/ updated Feb. 8, 2000, "80 Pin EEPROM SIMM Family."

Microchip Technology Incorporated, DS00551A, *Microchip AN551*, pp. 8–121 to 8–124, Copyright 1993, "Serial EEPROM Solutions vs. Parallel Solutions."

* cited by examiner

APPARATUS FOR ON-BOARD PROGRAMMING OF SERIAL EEPROMS

RELATED APPLICATIONS

This application is a continuation of U.S. application Ser. No. 09/382,570, filed Aug. 25, 1999, entitled "APPARATUS FOR ON-BOARD PROGRAMMING SERIAL EEPROMS," which is a continuation of U.S. application Ser. No. 08/873,971 filed Jun. 12, 1997, now U.S. Pat. No. 5,963,463, issued Oct. 5, 1999, entitled "METHOD FOR ON-BOARD PROGRAMMING OF PRD SERIAL EEPROMS," which is a continuation of U.S. application Ser. No. 08/648,555 filed May 15, 1996, now U.S. Pat. No. 5,661,677, issued Aug. 26, 1997, entitled "CIRCUIT AND METHOD FOR ON-BOARD PROGRAMMING OF PRD SERIAL EEPROMS."

TECHNICAL FIELD

This invention relates generally to electronic devices, and more particularly to memory modules.

BACKGROUND OF THE INVENTION

In today's computer systems, a computer's random access memory (RAM) typically includes a number of memory modules, such as single in-line memory modules (SIMMs) and dual in-line memory modules (DIMMs). These memory modules include a number of individual memory chips mounted on circuit board. The circuit board electrically connects the terminals of the chips to edge connectors located on a lower edge of the circuit board. The memory modules are then plugged into memory slots, which electrically connect the edge connectors of the memory module to other units within the computer system.

Computer designers may choose from numerous available standardized memory modules of various types, sizes and configurations. If each memory module can itself provide information identifying the type and size of the memory module to external circuitry, computer systems can be designed which are compatible with a wide variety of memory modules. Other components of the computer system simply access the information identifying the memory module and interact with the memory module accordingly.

There exist numerous and well-known ways of storing the information identifying the type and size of memory module. One such way is to provide a plurality of jumpers on the circuit board, the state of each of the jumpers indicating by binary code the type, size and configuration of memory module contained on the circuit board. Alternatively, a non-volatile memory device, such as a Serial EEPROM can be preprogrammed with the identifying code, and then mounted on the circuit board together with the volatile RAM units, such as dynamic random access memory devices (DRAMs).

SUMMARY OF THE INVENTION

According to the present invention, a memory module is provided which can be programmed with module information identifying the type and size of the memory module. This module information is conveniently programmed after completed assembly of the memory module. The memory module is configured to receive data from external circuitry for storing, and to provide stored data to the external circuitry. The memory module includes a plurality of terminals for electrically connecting the memory module to the external circuitry, and a plurality of volatile memory devices electrically connected to corresponding terminals for receiving and providing data from and to the external circuitry. The memory module includes a non-volatile memory device for storing the module information. The non-volatile memory device has a first port and a second port, with the first port electrically connected to a first of the terminals for providing the module information to the external circuitry. The second port of the non-volatile memory device is for receiving an enabling signal which selectively enables the non-volatile memory device to receive module information for storing within the non-volatile memory device or to provide the module information to the external circuitry.

The memory module also includes interface circuitry which couples the second port of the non-volatile memory device with a second of the module terminals. The second terminal is for connecting to an electric potential which enables the non-volatile memory device to receive module information for storage. The second terminal is coupled to the second port of the non-volatile memory with one of a number of possible circuit elements for temporarily connecting the second port of the non-volatile memory device with the second terminal. Examples of such circuit elements include a jumper, a low impedance unit, and a fuse.

In contrast with the prior art, which requires programming the module information in the non-volatile device prior to assembly of the memory module, the coupling of the second port of the non-volatile memory device with the second module terminal provides for ready programming of the module information after completed memory module assembly.

DETAILED DESCRIPTION OF THE INVENTION

A circuit and method for storing module information identifying the type and size of a memory module is described. In the following description, numerous specific details are set forth, such as specific memory device types and circuit elements, in order to provide a thorough understanding of the preferred embodiment of the present invention. It will be obvious, however, to one skilled in the art that the present invention may be practiced without these specific details. In other instances, well-known circuits and/or components have not been shown in detail in order not to unnecessarily obscure the present invention.

Figure 1:
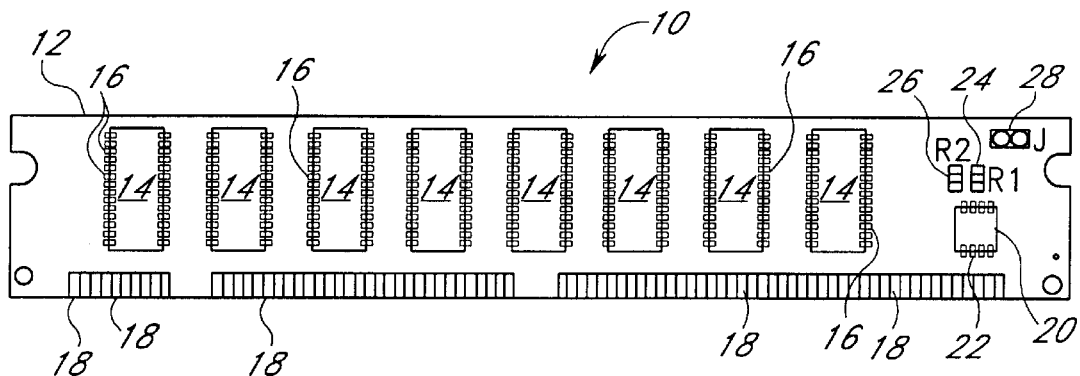
FIG. 1 is a plan view showing the primary side of an assembled memory module which includes a plurality of volatile memory devices and a non-volatile memory device, according to the present invention.

FIG. 1 shows the primary side of a memory module 10 according to the present invention. The module includes a substrate, such as a circuit board 12, on which a plurality of volatile memory devices, such as Dynamic Random Access Memory devices 14 (DRAMs), are mounted. Each of the DRAMs 14 includes a plurality of pins 16, each of which is electrically connected to a corresponding one of a plurality of memory module terminals or edge connectors 18.

The memory module 10 also includes a non-volatile memory device, such as a Serial Electrically Erasable Read- Only Memory device 20 (SEEPROM), mounted on the circuit board 12. The SEEPROM 20 has a plurality of ports or pins 22, each of which is connected to a corresponding one of the edge connectors 18 of the memory module 10. The SEEPROM 20 stores module information identifying the type and size of the memory module. For example, and without limitation, the memory module 10 depicted in FIG. 1 shows 8 DRAMs 14, each of which may be a 2 MEG×8 device. The memory module 10 may thus function as a 2 MEG×64 device, suitable for a variety of 64-bit applications. However, depending on how the pins 16 of the DRAMs 14 are connected to the edge connectors 18, the memory module 10 may also function as a 16 MEG×8 device, an 8 MEG×16 device, or a 4 MEG×32 device. The module information identifying the type and size of the memory module 10 would include such information as the storage capacity, word width, and edge connector configuration of the memory module. External circuitry such as processing circuitry (not shown) accessing the memory module 10 would first access the module information stored in the SEEPROM 20, and subsequently address the memory module accordingly.

The memory module 10 of FIG. 1 also includes a first impedance unit 24 or resistor R1, a second impedance unit 26 or resistor R2, and a temporary connection device 28 or jumper J. The resistors R1 and R2 and the jumper J are coupled with the SEEPROM 20 to provide for the storage and retrieval of the module information, as described below.

Figure 2:
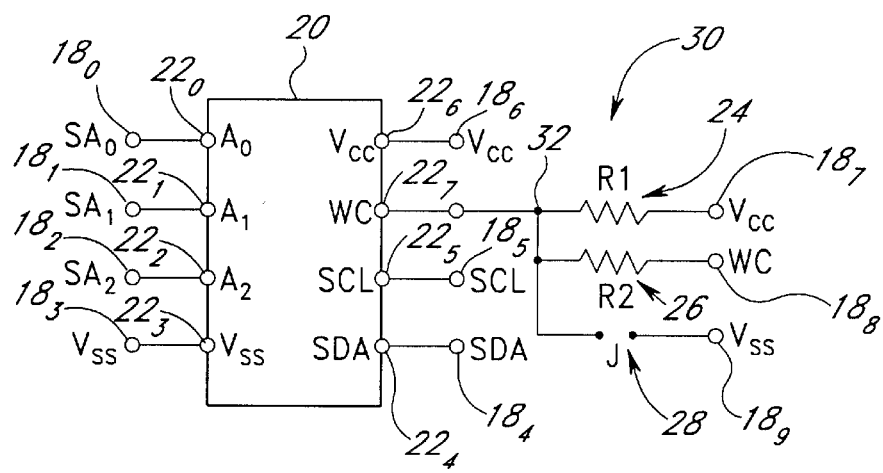
FIG. 2 is a part block, part schematic diagram showing the non-volatile memory device and interface circuitry coupling terminals of the memory module to the non-volatile memory device.

FIG. 2 is a part block, part schematic diagram showing details of the SEEPROM 20 and interface circuitry 30 including the resistors R1, R2 and the jumper J. The SEEPROM 20 includes eight pins 22 (numbered $22_0$–$22_7$), each of which is coupled to corresponding edge connectors 18 (numbered $18_0$–$18_9$). The pins $22_0$–$22_2$ are for setting the address bits $A_0$, $A_1$ and $A_2$, which determine the device or slave address of the SEEPROM 20. These pins $22_0$–$22_2$ are electrically connected to corresponding edge connectors $18_0$–$18_2$, which receive serial address signals $SA_0$, $SA_1$, and $SA_2$ for setting the address bits $A_0$–$A_2$. The pins $22_3$ and $22_6$ are for receiving supply voltages $V_{SS}$ and $V_{CC}$, respectively, and are connected to the corresponding edge connectors $18_3$ and $18_6$. The pin $22_4$, which is well known to the art as the Serial Data pin (SDA), is a bi-directional pin used to transfer data and address information into and out of the SEEPROM 20. The pin $22_5$, which is well known to the art as the Serial Clock pin (SCL), is used to clock all data and addressing information into and out of the SEEPROM 20. The pin $22_7$, which is well known to the art as the Write Control (WC) input, controls the ability to write data to the SEEPROM 20 for storage therein. Conventionally, when the WC input is tied to potential $V_{SS}$ (or ground) the SEEPROM 20 is enabled to perform write operations receiving data for storage within the SEEPROM. When WC is tied to supply potential $V_{CC}$, all writes are disabled and only read operations, in which data is retrieved from the SEEPROM 20, may be performed.

The function and operation of a non-volatile memory device, such as the SEEPROM 20, is well known to those skilled in the art, and is not described in great detail. Instead, the primary inventive aspects relate to coupling the WC pin $22_7$ to a plurality of edge connectors 18 of the memory module 10.

FIG. 2 shows the first impedance unit 24 or resistor R1 which couples the WC pin $22_7$ to the supply voltage $V_{CC}$ at edge connector $18_7$. Additionally, the second impedance unit 26 or resistor R2 couples the WC pin $22_7$ to edge connector $18_8$, and a temporary connection device 28 or jumper J couples the WC pin to the supply voltage $V_{SS}$ (or ground) at edge connector $18_9$.

The jumper J provides for temporary connection of the WC pin to $V_{SS}$ (or ground), thereby pulling down the potential of node 32 (the supply voltage $V_{CC}$ is then temporarily dissipated as a voltage drop across resistor R1). Alternatively, the second resistor R2 is a very low impedance unit (such as a low value resistor or metal trace), and connection of edge connector $18_8$ to potential $V_{SS}$ (or ground) similarly pulls down the potential of node 32. This enables the SEEPROM 20 to receive address and data on the SDA pin $22_4$ for writing of that data in the SEEPROM 20. When jumper J is not engaged, and when edge connector $18_8$ is disconnected from any voltage or signal source, the node 32 and WC pin $22_7$ are held at a high potential, by virtue of the first resistor R1 coupled to supply voltage $V_{CC}$ at edge connector $18_7$. In this case, the SEEPROM 20 is disabled for purposes of any write operations, and only read operations may be performed.

The present invention allows convenient programming of the module information identifying the type and size of the memory module 10 (see FIG. 1) after completed assembly of the module. For example, during testing of the assembled memory module 10, the SEEPROM 20 can be placed in write mode either by engagement of the jumper J or connection of potential $V_{SS}$ to edge connector $18_8$. External circuitry such as programming circuitry (not shown) then provides the necessary address and module information data to the SDA pin $22_4$.

The present invention provides numerous advantages over the prior art which requires preprogramming of the module information in the SEEPROM 20 (or other suitable non-volatile memory device) prior to assembly on the circuit board 12 of the memory module 10. Providing for programming of the SEEPROM after completed assembly of the memory module 10 avoids the disadvantages associated with: (1) preprogrammed SEEPROMs which are subsequently not used for the intended memory module and must therefore be reprogrammed; (2) preprogrammed SEEPROMs which, upon testing, indicate errors in the preprogramming which are not easily correctable on the assembled memory module; and (3) making certain each preprogrammed SEEPROM is placed in a memory module with a DRAM configuration corresponding to the module information stored in the SEEPROM.

The present invention also has great design flexibility by providing more than one edge corrector 18 through which the node 32 connected to the WC pin $22_7$ can be pulled low (see FIG. 2). If, for example, the edge connector $18_8$ is an "extra" edge connector—i.e., an edge connector not intended (according to the standard pin-out) for use when the memory module is installed in a computer system—then using it for programming the SEEPROM 20 optimizes use of the limited number of edge connectors. On the other hand, if no such "extra" edge connectors are available, the use of the jumper J allows a temporary connection to the edge connector $18_9$ which will ordinarily be used for connection to supply voltage $V_{SS}$ (or ground) for operation of other components of the memory module 10. Alternatively, the design can substitute a fuse for the second resistor R2, with the fuse being blown subsequent to completing the programming of the SEEPROM 20 and testing of the memory module 10.

Figure 3:
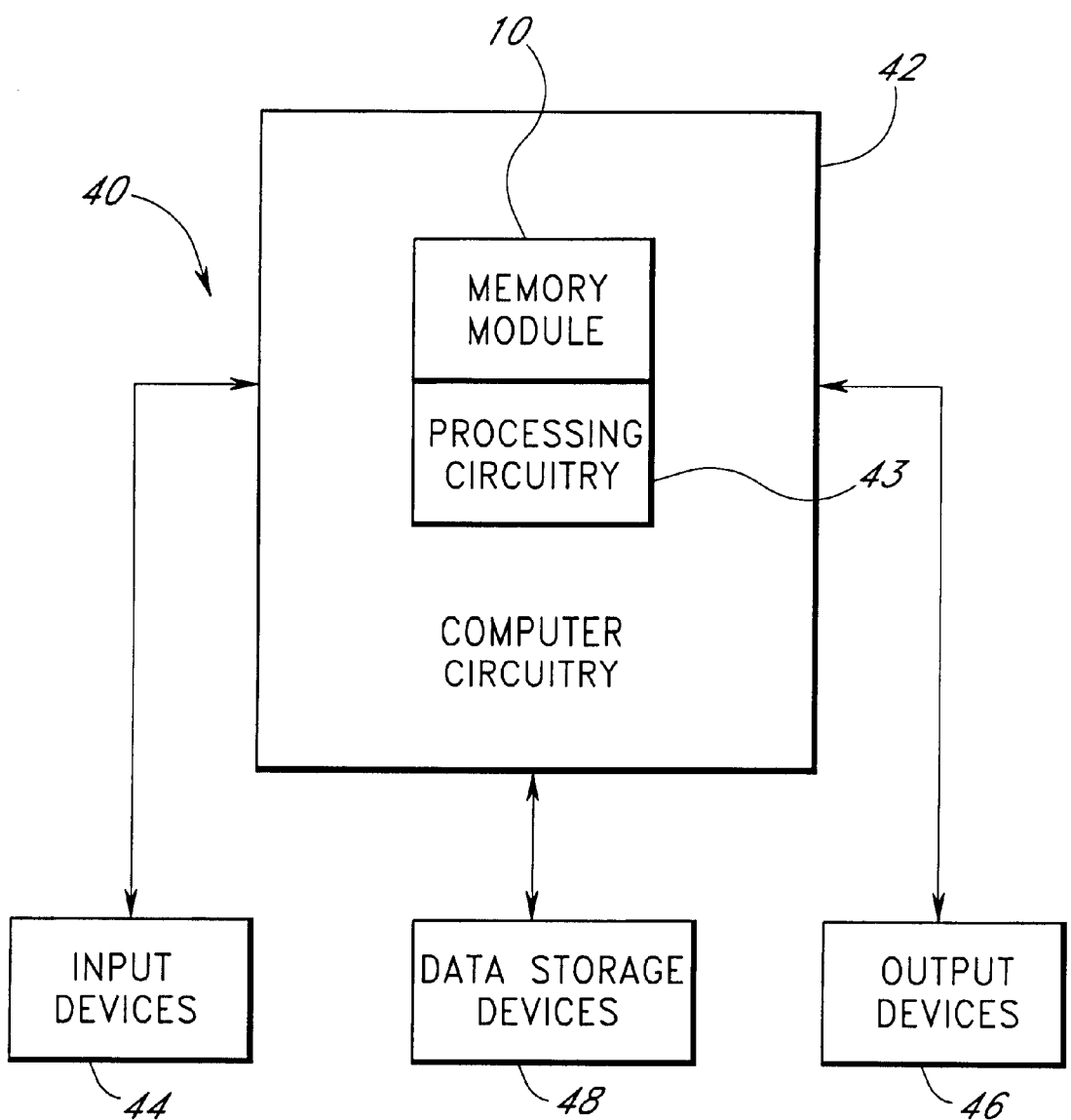
FIG. 3 is a functional block diagram of a computer system according to the present invention.

FIG. 3 is a block diagram of a computer system 40 that uses a memory module 10 according to the present invention. The computer system 40 includes computer circuitry 42 for performing such computer functions as executing software to perform desired calculations and tasks. Circuitry 42 typically contains processing circuitry 43 and the memory module 10 as shown. One or more input devices 44, such as a keyboard or a pointing device, is coupled to the computer circuitry 42 and allows an operator (not shown) to manually input data thereto. One or more output devices 46 is coupled to the computer circuitry 42 to provide to the operator data generated by the circuitry. Examples of output devices 46 include a printer and a video display unit. One or more data storage devices 48 is coupled to the computer circuitry 42 to store data on or retrieve data from external storage media (not shown). Examples of storage devices 48 and associated storage media include drives that accept hard and floppy disks, magnetic tape recorders, and compact-disc read only memory (CD-ROM) readers.

It will be appreciated that, although an embodiment of the invention has been described above for purposes of illustration, various modifications may be made without deviating from the spirit and scope of the invention. For example, while the present invention has been described as applicable to a memory module including DRAM devices, the invention is equally applicable to any assembly of memory devices forming a single functioning memory module. Also, while certain edge connectors of the memory module have been identified as distinct, they need not be (e.g., edge connectors $18_9$ and $18_3$ could be the same, and edge connectors $18_7$ and $18_6$ could be the same). Also, any of a variety of suitable non-volatile memory devices could be used in place of the SEEPROM 20 described and depicted. For example, the present invention does not require a serial non-volatile device, and address and data information could be applied in parallel to separate address and data ports rather than serially, as described above. Similarly, any of a variety of well-known devices for temporarily connecting the Write Control pin to $V_{SS}$ could be substituted for the low value resistor, jumper or fuse described above. For example, an antifuse or a transistor (turned off in other than a particular test mode) would be suitable substitutes. Additionally, the Write Control pin need not be coupled to edge connectors of the memory module, but may instead be coupled to other "terminals" such as test pads, pins, vias or points which are conveniently accessed by, for example, a test probe or external jumper connection. Further, it may be advantageous to provide a plurality of non-volatile memory devices for storage of module identifing information, and these devices may have device addresses identified by static connection to $V_{CC}$ and $V_{SS}$ or driven dynamically by test circuitry. Numerous variations are well within the scope of this invention. Accordingly, the invention is not limited except as by the appended claims.

What is claimed is:

1. A memory module for storing data, comprising:

a substrate having a plurality of edge connectors;

a plurality of volatile memory devices mounted on the substrate, at least one of said memory devices being electrically connected to a first of the edge connectors; and a serial EEPROM mounted on the substrate and electrically connected to a second of the edge connectors, the serial EEPROM operable to receive module identification information for storage therein;

wherein the serial EEPROM includes a port coupled with the second edge connector and operable to receive a signal enabling the serial EEPROM to receive the module identification information for storage therein.

2. The memory module of claim 1, wherein the plurality of volatile memory devices are dynamic random access memory devices (DRAMs).

3. The memory module of claim 2, wherein the port coupled with the second edge connector is operable independent of control of the DRAMs.

4. The memory module of claim 1, wherein the port coupled with the second edge connector is operable independent of control of the volatile memory devices.

5. A memory module for storing data, comprising:

a substrate having a plurality of electrical edge connectors;

a plurality of dynamic random access memory devices (DRAMs) mounted on the substrate, at least one of said DRAMS being electrically connected to at least a first of the edge connectors; and a serial EEPROM mounted on the substrate and electrically connected to a second of the edge connectors, the serial EEPROM operable to receive complete module identification information through the second edge connector for storage therein;

wherein the serial EEPROM includes a port coupled with a third edge connector and operable to receive a signal enabling the serial EEPROM to receive the module identification information for storage therein.

6. The memory module of claim 5, wherein the third edge connector is operable independent of control of the DRAMs.

7. A memory module for storing data, comprising:

a substrate having a plurality of edge connectors;

a plurality of dynamic random access memory devices (DRAMs) having a plurality of pins, the DRAMs mounted on the substrate and at least one of the DRAMs being electrically connected to a first of the edge connectors; and a serial EEPROM having a first supply voltage pin, a second supply voltage pin, and a write control pin, the first supply voltage pin electrically connected to a second of the edge connectors, the second supply voltage pin electrically connected to a third of the edge connectors, and the write control pin electrically connected to a fourth of the edge connectors and electrically connected to a resistor, the resistor electrically connected to a fifth edge connector.

8. The memory module of claim 7, wherein the fifth edge connector is electrically connected to the first supply voltage pin.

9. The memory module of claim 7, wherein the serial EEPROM has a plurality of address pins and the state of the write control pin of the serial EEPROM can be set independent of the state of the address pins.

10. A memory module for storing data, comprising:

a substrate having a plurality of edge connectors;

a plurality of dynamic random access memory devices (DRAMs) having a write enable pin, the DRAMs mounted on the substrate and at least one of the DRAMs being electrically connected to a first of the edge connectors, so as to receive a write enable signal that enables writing to the DRAMs; and a serial EEPROM having a first supply voltage pin, a second supply voltage pin, and a write control pin, the first supply voltage pin electrically connected to a second of the edge connectors, the second supply voltage pin electrically connected to a third of the edge connectors, the write control pin electrically connected to a fourth of the edge connectors, the fourth of the edge connectors for receiving a write control signal that enables writing to the serial EEPROM;

wherein the state of the fourth of the edge connectors can be set by external circuitry independent of the state of the first of the edge connectors.

11. The memory module of claim 10, wherein the serial EEPROM write control pin is electrically connected to a resistor that is electrically connected to a fifth edge connector.

12. The memory module of claim 11, wherein the fifth edge connector is electrically connected to the first supply voltage pin.

13. The memory module of claim 10, wherein the serial EEPROM has a plurality of address pins and the state of the write control pin of the serial EEPROM can be set independent of the state of the address pins.

14. A memory module for storing data, comprising:

a substrate having a plurality of edge connectors;

a plurality of dynamic random access memory devices (DRAMs) having a write enable pin, the DRAMs mounted on the substrate and at least one of the DRAMs being electrically connected to a first of the edge connectors, so as to receive a write enable signal that enables writing to the DRAMs; and a serial EEPROM having a first supply voltage pin, a second supply voltage pin, a plurality of address pins, and a write control pin, the first supply voltage pin electrically connected to a second of the edge connectors, the second supply voltage pin electrically connected to a third of the edge connectors, and the write control pin electrically connected to a fourth of the edge connectors and to a resistor that is electrically connected to a fifth of the edge connectors and to the first supply voltage pin, the fourth of the edge connectors for receiving a write control signal that enables writing to the serial EEPROM;

wherein the state of the fourth of the edge connectors can be set by external circuitry independent of the state of the first of the edge connectors and the state of the address pins.

* * * * *